US006760407B2

(12) United States Patent
Price et al.

(10) Patent No.: US 6,760,407 B2
(45) Date of Patent: Jul. 6, 2004

(54) X-RAY SOURCE AND METHOD HAVING CATHODE WITH CURVED EMISSION SURFACE

(75) Inventors: J. Scott Price, Wauwatosa, WI (US); Bruce M. Dunham, Mequon, WI (US); Colin R. Wilson, Niskayuna, NY (US)

(73) Assignee: GE Medical Global Technology Company, LLC, Waukesha, WI (US)

( * ) Notice: Subject to any disclaimer, the term of this patent is extended or adjusted under 35 U.S.C. 154(b) by 90 days.

(21) Appl. No.: 10/124,864

(22) Filed: Apr. 17, 2002

(65) Prior Publication Data

US 2003/0198318 A1 Oct. 23, 2003

(51) Int. Cl.[7] .................................................. H01L 35/06
(52) U.S. Cl. ........................................ 378/122; 378/119
(58) Field of Search ................................ 378/122, 119, 378/4

(56) References Cited

U.S. PATENT DOCUMENTS 4,012,656 A * 3/1977 Norman et al. ............. 378/122
4,289,969 A * 9/1981 Cooperstein et al. .......... 378/9
5,844,216 A 12/1998 Fathi et al.
6,297,592 B1 10/2001 Goren et al.
6,333,968 B1 * 12/2001 Whitlock et al. ........... 376/136

OTHER PUBLICATIONS

"Soft lithography used to fabricate transistors on curved substrates"; 3–pg. document; [obtained from Internet www.news.uiuc.edu/scitips/00/11softlitho.html]; [page last update Oct. 26, 2001].

"Soft Lithography"; 5–pg. document; published Jan. 1998; WTECHyper–Librarian.

(List continued on next page.)

*Primary Examiner*—Edward J. Glick
*Assistant Examiner*—Hoon Song
(74) *Attorney, Agent, or Firm*—Foley & Lardner LLP

(57) ABSTRACT

An X-ray source comprises a cold cathode and an anode. The cold cathode has a curved emission surface capable of emitting electrons. The anode is spaced apart from the cathode. The anode is capable of emitting X-rays in response to being bombarded with electrons emitted from the curved emission surface of the cathode.

31 Claims, 4 Drawing Sheets

OTHER PUBLICATIONS

"The future of electronics manufacturing is revealed in the fine print"; Ralph G. Nuzzo; PNAS; vol. 98, No. 9, pp. 4827–4829 (Apr. 24, 2001).

"Low–Temperature Fabrication of Si Thin–Film Transistor Microstructures by Soft Lithographic Patterning on Curved and Planar Substrates"; Erthardts et al.; Chemistry of Materials, vol. 12, No. 11, pp. 3306–3315 (Nov. 2000).

"Nucleation and growth of carbon nanotubes by microwave plasma chemical vapor deposition"; Bower et al.; Applied Physics Letters, vol. 77, No. 17, pp. 2767–2769 (Oct. 23, 2000).

"Large current density from carbon nanotubes field emitters"; Zhu et al.; Applied Physics Letters, vol. 75, No. 6, pp. 873–875 (Aug. 9, 1999).

"Application of carbon nanotubes as electrodes in gas discharge tubes"; Rosen et al.; Applied Physics Letters, vol. 76, No. 13, pp. 1668–1670 (Mar. 27, 2000).

"Work functions and valence band states of pristine and Cs–intercalated single–walled carbon nanotube bundles"; Applied Physics Letters, vol. 76, No. 26, pp. 4007–4009 (Jun. 26, 2000).

"Fabrication and Field Emission Properties of Carbon Nanotube Cathodes"; Bower et al.; 6–pg. document; Proceeding of 1999 MRS Fall Meeting.

"10 Applications of Carbon Nanotubes"; Ajayan et al.; pp. 274–315.

"Patterned negative electron affinity photocathodes for maskless electron beam lithography"; Schneider et al.; J. Vac. Sci. Technol.; pp. 3192–3196 (Nov./Dec. 1998).

"Semiconductor on glass photocathodes for high throughput maskless electron beam lithography"; Baum et al.; J. Vac. Sci. Technol.; pp. 2707–2712 (Nov./Dec.).

"Physical properties of thin–film field emission cathodes with molybdenum cones"; Spindt et al.; Journal of Applied Physics, vol. 47, No. 12, pp. 5246–5263 (Dec. 1976).

* cited by examiner

X-RAY SOURCE AND METHOD HAVING CATHODE WITH CURVED EMISSION SURFACE

BACKGROUND OF THE INVENTION

The present invention relates generally to systems and methods that employ X-ray sources.

X-ray sources have found widespread application in devices such as imaging systems. X-ray imaging systems utilize an X-ray source in the form of an X-ray tube to emit an X-ray beam which is directed toward an object to be imaged. The X-ray beam and the interposed object interact to produce a response that is received by one or more detectors. The imaging system then processes the detected response signals to generate an image of the object.

For example, in typical computed tomography (CT) imaging systems, an X-ray tube projects a fan-shaped beam which is collimated to lie within an X-Y plane of a Cartesian coordinate system and generally referred to as the "imaging plane". The X-ray beam passes through the object being imaged, such as a patient. The beam, after being attenuated by the object, impinges upon an array of radiation detectors. The intensity of the attenuated radiation beam received at the detector array is dependent upon the attenuation of the X-ray beam by the object. Each detector element of the array produces a separate electrical signal that is a measurement of the beam attenuation at the detector location. The attenuation measurements from all the detectors are acquired separately to produce a transmission profile.

In known third-generation CT systems, the X-ray tube and the detector array are rotated with a gantry within the imaging plane and around the object to be imaged so that the angle at which the X-ray beam intersects the object constantly changes. A group of X-ray attenuation measurements, i.e. projection data, from the detector array at one gantry angle is referred to as a "view". A "scan" of the object comprises a set of views made at different gantry angles during one revolution of the X-ray source and detector. In an axial scan, the projection data is processed to construct an image that corresponds to a two-dimensional slice taken through the object.

Conventional X-ray tubes comprise a vacuum vessel, a cathode assembly, and an anode assembly. The vacuum vessel is typically fabricated from glass or metal, such as stainless steel, copper or a copper alloy. The cathode assembly and the anode assembly are enclosed within the vacuum vessel.

To generate an X-ray beam, the cathode emits electrons which are then accelerated toward the anode, causing the electrons to impact a target zone of the anode at high velocity. The acceleration is caused by a voltage difference (typically, in the range of 20 kV to 140 kV for medical purposes, although possibly higher or lower especially for non-medical purposes) which is maintained between the cathode and anode assemblies. The X-rays emanate from a focal spot of the target zone in all directions, and a collimator is then used to direct X-rays out of the vacuum vessel in the form of an X-ray fan beam toward the patient.

In typical X-ray tubes, electrons are emitted from the cathode by a process known as thermionic emission. According to this process, the cathode filament (which is typically formed of a tungsten wire) is provided a current that causes resistive heating of the filament to high temperatures. At such temperatures, the electrons in the filament have sufficient energy that they do not bond to specific atoms (the energy level of the electrons places the electrons in the conduction band) and therefore are susceptible to being emitted from the cathode. A complex focusing structure is used to direct the electrons toward the focal spot.

A problem that is therefore encountered is that the cathode is continuously provided with electrical energy which is converted to heat energy, and it is necessary to remove the heat energy from the cathode. Removing heat energy from the cathode is difficult, however, because the cathode is located inside the vacuum vessel and therefore convection is not available as a heat transfer mechanism. Additionally, although conduction is available as a heat transfer mechanism, the large voltage differential that is maintained between the cathode and the anode results in the construction of the cathode being undesirably complex, especially when taken in combination with the complex focusing mechanism that is also provided. A more significant problem is that the heat causes the filament to move (thermal expansion) and changes the location and shape of the focal spot on the target.

Therefore, an improved X-ray source which reduces the need for heat transfer away from the cathode and which is relatively simple in construction would be highly advantageous.

BRIEF SUMMARY OF THE INVENTION

In a first preferred aspect, an X-ray source comprises a cold cathode and an anode. The cold cathode has a curved emission surface capable of emitting electrons. The anode is spaced apart from the cathode. The anode is capable of emitting X-rays in response to being bombarded with electrons emitted from the curved emission surface of the cathode.

In a second preferred aspect, an imaging system for imaging an object of interest comprises an X-ray source, a detector array, an image reconstructor, and a display. The X-ray source includes a cold cathode and an anode both of which are disposed within a housing. The cold cathode has a curved emission surface and comprises a plurality of emitters disposed on a substrate. The anode is spaced apart from the cathode, and emits X-rays in response to being bombarded with electrons emitted from the curved emission surface.

The detector array comprises a plurality of detector elements which receive the X-rays after the X-rays pass through the object of interest and which generate signals in response thereto. The image reconstructor is coupled to receive the signals from the detector elements, and constructs an image of the object of interest based on the signals from the detector elements. The display is coupled to the image reconstructor and displays the image of the object of interest.

Other principle features and advantages of the present invention will become apparent to those skilled in the art upon review of the following drawings, the detailed description, and the appended claims.

DETAILED DESCRIPTION OF THE INVENTION

Figure 1:
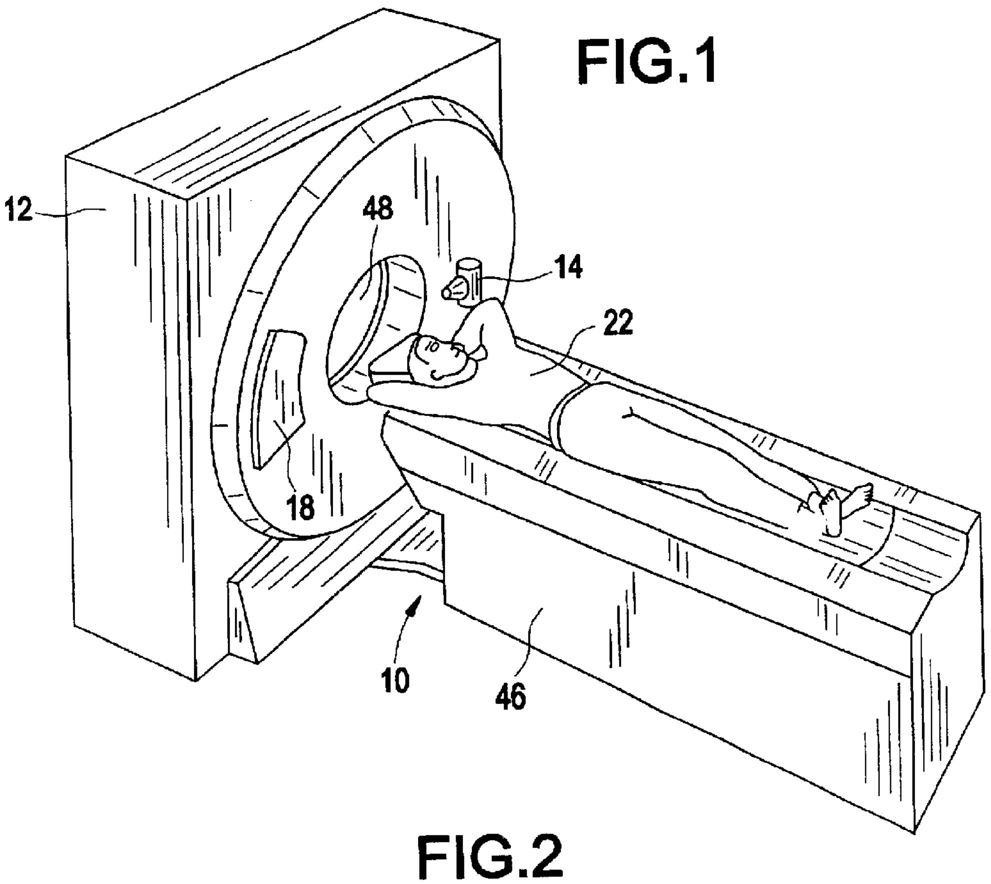
FIG. 1 is a pictorial view of an imaging system.
Figure 2:
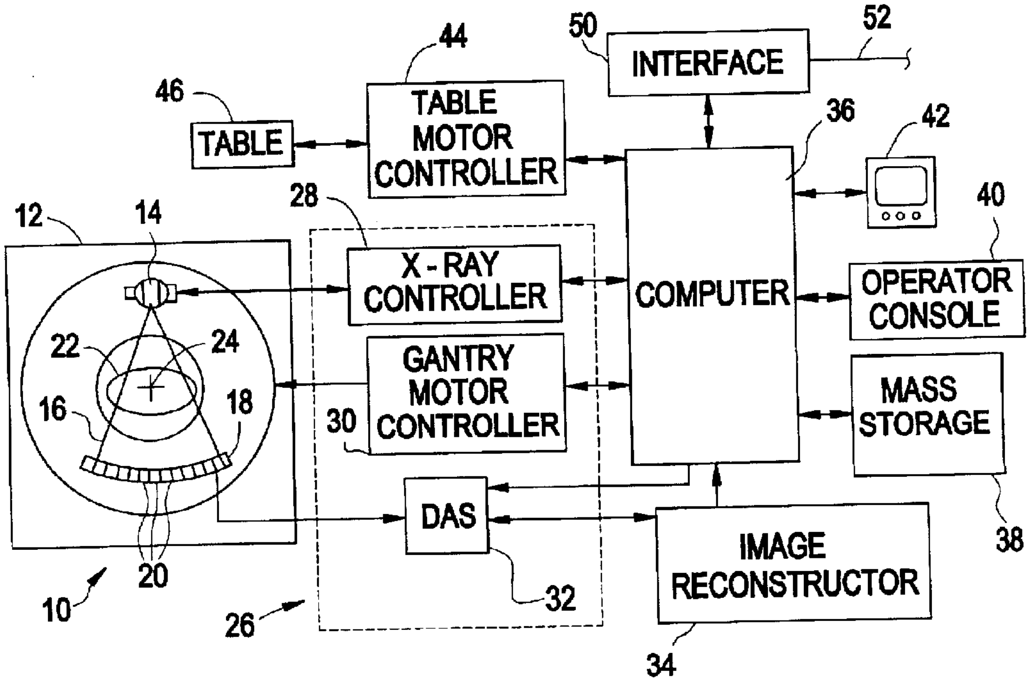
FIG. 2 is a block schematic diagram of the system illustrated in FIG. 1.

Referring to FIGS. 1 and 2, a system 10 that uses an X-ray source 14 is shown. The X-ray source 14 may be used in any application that uses X-rays. For example, in medical applications, the X-ray source may be used to implement a radiography system. In security applications, the X-ray source may be used to implement a baggage checking or other security checkpoint imaging systems. By way of example, the system 10 in FIGS. 1–2 is a radiography system used for medical imaging, and in particular a computed tomography (CT) imaging system.

The CT system 10 includes a gantry 12 representative of a “third generation” CT scanner. The X-ray source 14 is an X-ray tube and is mounted to the gantry 12 and generates a beam of X-rays 16 that is projected toward a detector array 18 mounted to an opposite side of the gantry 12. The X-ray beam 16 is collimated by a collimator (not shown) to lie within an X-Y plane of a Cartesian coordinate system and generally referred to as an “imaging plane”. The detector array 18 is formed by detector elements 20 which together sense the projected X-rays that pass through an object of interest 22 such as a medical patient. The detector array 18 may be a single-slice detector, a multi-slice detector, or other type of detector. Each detector element 20 produces an electrical signal that represents the intensity of an impinging X-ray beam after it passes through the patient 22. During a scan to acquirer X-ray projection data, the gantry 12 and the components mounted thereon rotate about a gantry axis of rotation 24.

Rotation of the gantry 12 and the operation of the X-ray tube 14 are governed by a control mechanism 26 of the CT system 10. The control mechanism 26 includes an X-ray controller 28 that provides power and timing signals to the X-ray tube 14 and a gantry motor controller 30 that controls the rotational speed and position of the gantry 12. A data acquisition system (DAS) 32 in the control mechanism 26 samples analog data from the detector elements 20 and converts the data to digital signals for subsequent processing. An image reconstructor 34 performs image reconstruction (preferably, high speed image reconstruction) based on the signals received from the detector array 18 by way of the DAS 32. The image reconstructor 34 may be any signal processing device capable of reconstructing images based on signals received from the detector array 18.

A cathode ray tube or other type of display 42 is coupled to the image reconstructor 34 by way of a computer 36, such that the display 42 is able to receive and display the reconstructed image from the image reconstructor 34. The computer 36 receives the reconstructed image, stores the image in a mass storage device 38, and drives the display 42 with signals that cause the display 42 to display the reconstructed image. The images may be displayed as they are acquired or stored for later viewing. The computer 36 also receives commands and scanning parameters from an operator via console 40 that has a keyboard. The operator-supplied commands and parameters are used by the computer 36 to provide control signals and information to the DAS 32, the X-ray controller 28 and the gantry motor controller 30. In addition, the computer 36 operates a table motor controller 44 which controls a motorized table 46 to position the patient 22 in the gantry 12. Particularly, the table 46 moves portions of the patient 22 along a Z-axis through gantry opening 48.

The computer 36 is coupled to a communication interface 50 which connects the computer 36 to a communication network 52. The communication network 52 may be a local area network, metropolitan area network, or wide area network that connects a group of clinics and/or hospitals. The communication network 52 may also be the Internet. The communication interface 50 is used to transmit medical images or other data acquired using the CT system 10 to other devices on the communication network 52. The communication interface 50 may also be used to transmit data pertaining to the health and operation of the system 10, for example, for predictive maintenance or prognostics. The communication interface 50 may also be used to receive control signals from other devices on the communication network 52 which control the system 10.

It should be noted that the embodiment of FIG. 2 is merely one possible configuration of a CT system that employs the X-ray source 14. For example, although the X-ray controller and the image reconstructor are both shown as devices which are separate from the computer 36, it is also possible to integrate the X-ray controller 28 and/or the image reconstructor 34 into the computer 36. Additionally, as previously noted, the X-ray source could also be used in other applications.

Figure 3:
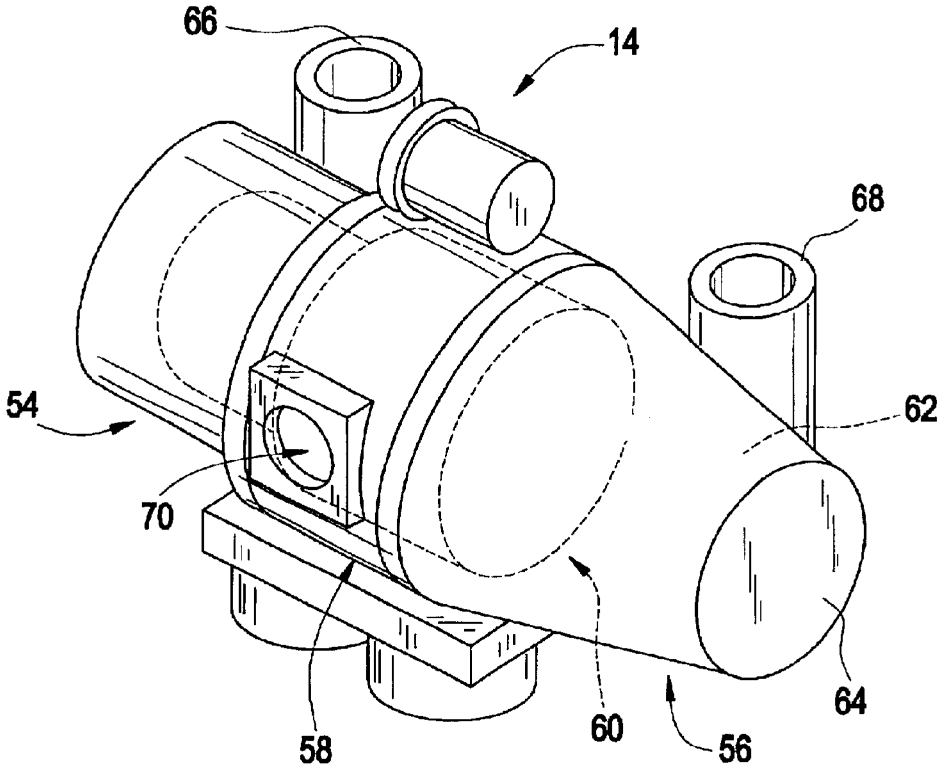
FIG. 3 is a perspective view of a casing enclosing an X-ray tube insert.

FIG. 3 illustrates the X-ray tube 14 in greater detail. The X-ray tube 14 includes an anode end 54, a cathode end 56, and a center section 58 positioned between the anode end 54 and the cathode end 56. The X-ray tube 14 includes an X-ray tube insert 60 which is enclosed in a fluid-filled chamber 62 within a casing 64. Electrical connections to the X-ray tube insert 60 are provided through an anode receptacle 66 and a cathode receptacle 68. X-rays are emitted from the X-ray tube 14 through a casing window 70 in the casing 64 at one side of the center section 58.

Figure 4:
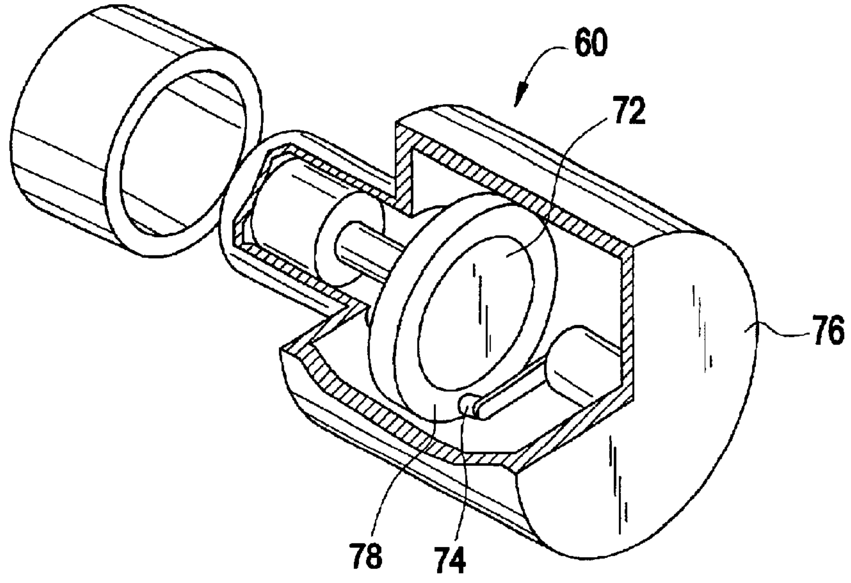
FIG. 4 is a sectional perspective view with the stator exploded to reveal a portion of an anode assembly of the X-ray tube insert of FIG. 3.

As shown in FIG. 4, the X-ray tube insert 60 includes a target anode assembly 72 and a cathode assembly 74 disposed in a vacuum within a vacuum vessel 76. The anode assembly 72 is spaced apart from the cathode assembly 74. A stator 77 is positioned over vessel 76 adjacent to anode assembly 72. Upon the energization of the electrical circuit connecting anode assembly 72 and the cathode assembly 74, which produces a potential difference of, e.g., 60 kV to 140 kV, electrons are directed from the cathode assembly 74 to the anode assembly 72. The electrons strike a focal spot within a target zone 78 of the anode assembly 72 and produce high frequency electromagnetic waves, or X-rays, and residual thermal energy. The target zone 78 emits X-rays in response to being bombarded with electrons emitted from the filament in the cathode assembly 74. The X-rays are directed out through the casing window 70, which allows the X-rays to be directed toward the object 22 being imaged (e.g., the patient).

Figure 5:
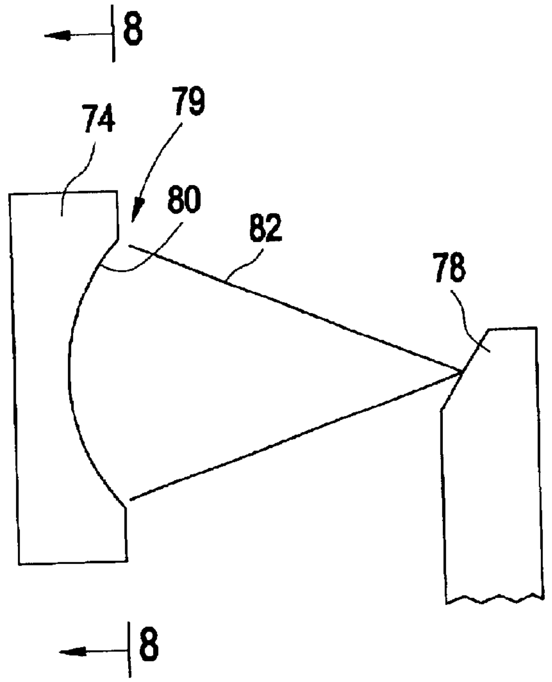
FIG. 5 is a simplified schematic view of a solid state cathode of the X-ray tube of FIG. 3.
Figure 6:
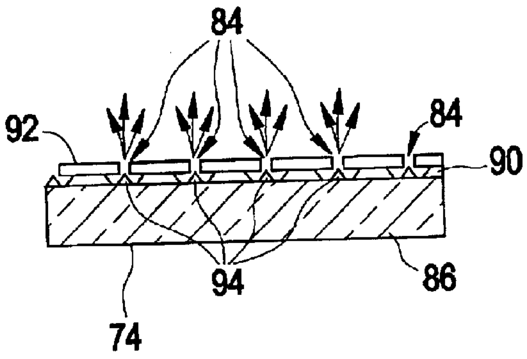
FIG. 6 is a cross sectional view of a portion of the solid state cathode of FIG. 5.
Figure 7:
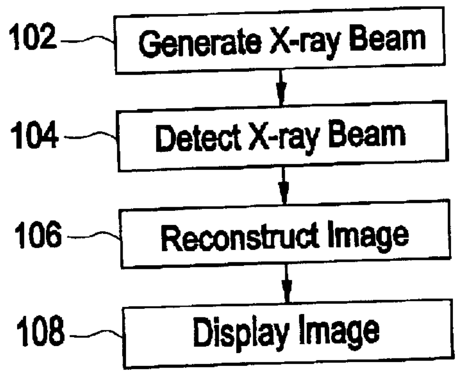
FIG. 7 is a flowchart of the operation of the system of FIG. 1.

FIGS. 5–7 show the cathode assembly 74 in greater detail. As shown in FIG. 5, the cathode assembly 74 comprises a cold cathode 79 having a curved surface 80 and which emits electrons to produce an electron beam 82. In this context, the cold cathode is referred to as such because its operation does not depend on its temperature being above ambient temperature. In practice, typically, the operating temperature of a cold cathode is above ambient temperature, just not as much above ambient temperature as thermionic cathodes.

The surface 80 provides a focusing mechanism for the electron beam 82 and preferably has a shape that is optimized in accordance with the geometry of the beam and therefore the desired focal spot. The beam profile may have different shapes, e.g., square, round, hollow, and so on. The shape of the curved emission surface at least partially determines the size and shape of the focal spot on the target zone 78 of the anode assembly 72. The surface 80 may be curved in two or three dimensions. The surface 80 may, for example, have a parabolic shape or the shape of a portion of a sphere. Alternatively, the surface 80 can be curved along a first axis and straight along a second axis which is orthogonal to the first axis (e.g., cylindrical), curved in two dimensions with different radii in the two directions, or a surface with a variable curvature over its area.

The cathode 79 is preferably formed of a monolithic semiconductor. In one embodiment, shown in FIG. 6, the cathode 79 is a solid state field emission array fabricated using soft-lithographic patterning on a curved substrate. In other embodiments, the cathode 79 may be fabricated of carbon nanotubes disposed in an array that forms a curved emission surface. Other arrangements could also be used.

FIG. 6 is an enlarged view of a portion of the curved surface 80. The cathode is formed of a plurality of cathode emitters 84 formed on a substrate 86. The substrate 86 has an insulating layer 90, a cathode gate film conductor 92, and a plurality of cones 94. The insulating layer 90 is preferably discontinuous, i.e., with spaces therebetween. The spaces may have dimensions on the order of 1–3 microns or less. The cones 94 may, for example, be molybdenum cones emitters that are used to generate the electrons. Other materials/structures could also be used, such as Spindt emitters. The cones 94 are preferably disposed with the spaces between the insulating layer so that the cones 94 directly contact the substrate 86. The gate film 92 may also be formed of molybdenum or other similar metal. In operation, a bias voltage is applied to the gate film 92 to establish an electric field that causes the cones 94 to emit electrons. In one embodiment, by way of example, the cones 94 each have an effective emitting area on the order of about $1\times10^{-15}$ $cm^2$, such as $1.2\times10^{-15}$ $cm^2$, and each cone can produce a current up to 1 mA/tip or more when the electric field at its tip is sufficiently large. According to known fabrication techniques, cone packing densities in excess of $1\times10^9$ $cones/cm^2$. Additionally, current densities of over 2400 $A/cm^2$ are also achievable. Total beam current can be controlled using a low bias voltage such as 120 V DC or below, and preferably down to 20 V DC or lower between the emitters 84 and the gate film 92. Of course, as improvements are made in soft lithographic techniques, these parameters may be improved upon.

FIG. 7 is a flowchart showing an overview of the operation of the system of FIG. 1. At step 102, an X-ray beam is generated at the X-ray source 14. To generate the X-ray beam, a first electric field is applied between the gate film 92 and the emitter cones 94. The first electric field causes the electrons to be emitted from the emitter cones 94. The first electric field may be produced by applying a low bias voltage (<50 V) to the gate film 92. A second electric field is applied between the anode assembly 72 and the cathode 79. The second electric field causes the electrons to accelerate towards the target zone 78 of the anode assembly 72. The second electric field may be generated using a voltage in the range of 1 kilovolt to 1000 kilovolts, depending on the application as detailed below. At step 104, after the X-ray beam passes through at least a portion of the patient or other object of interest 22, the X-ray beam is detected at the detector array 18. Then, at step 106, the image reconstructor 34 constructs an image of a portion of the patient 22 based on data collected during the detecting step 104. Finally, at step 108, the image of the portion of the patient 22 or other object of interest is displayed to an operator.

Figure 8:
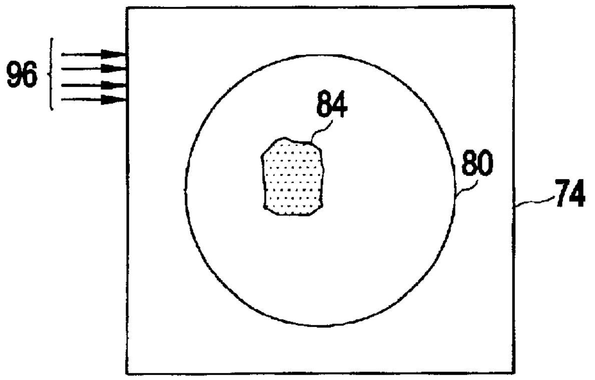
FIG. 8 is a front view of the solid state cathode of FIG. 5.
Figure 9:
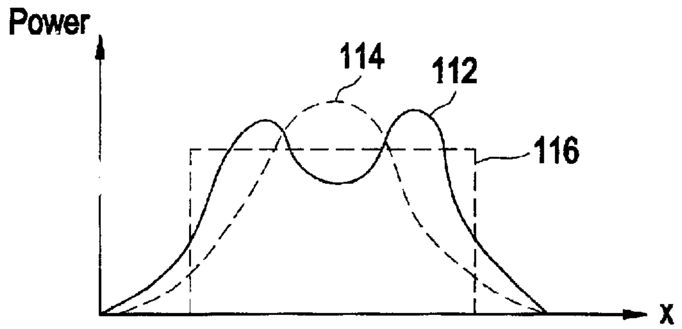
FIG. 9 is a set of curves showing intensity profiles achievable with the solid state cathode of FIG. 5.

As shown in FIG. 8, the emitters 84 are disposed in a two-dimensional array. For simplicity, only some of the emitters are shown in FIG. 8. Preferably, the emitters 84 are arranged in groups with the gate film 92 for each group being electrically isolated from the gate film 92 of each of the remaining groups. In this way, each of the groups of emitters 84 is individually addressable using control lines 96. Although a group size of one could be used, larger group sizes are preferred in order to simplify construction of the cathode 79.

The emitters 84 are controlled by the X-ray controller 28. The addressability of the emitters 84 allows a number of features to be implemented by providing different control signals to different ones of the groups of emitters 84.

For example, the X-ray controller 28 is operative to adjust the control signals to the cathode 79 to control the size and shape of the focal spot. The beam shape and size is varied by turning on or off various ones or groups of the emitter 84. Additionally, the X-ray controller 28 is operative to adjust the control signals to the cathode 79 to control the intensity distribution of the focal spot. Thus, as shown in FIG. 8, the focal spot is characterized by an intensity distribution which describes intensity (or current density distribution) of electron bombardment as a function of position (FIG. 8 shows this for one dimension). Curve 112 shows a typical distribution achievable with a filament; curve 114 shows a gaussian distribution achievable with the cathode 79; and curve 116 shows a uniform distribution achievable with the cathode 79. It is possible to dynamically adjust the focal spot size, shape, and/or intensity distribution of the emitter array depending on which elements are activated and/or the amount of power provided to each element. This can be used to address variabilities in the emitter array associated with manufacturing processes, and to otherwise optimize the beam profile. The current density distribution can also be adjusted as necessary to minimize the heating effects on the target zone 78 of the anode assembly 72.

Additionally, the X-ray controller 28 is operative to adjust the control signals to the cathode 79 as a function of feedback information received by the X-ray controller 28 pertaining to the operation of the imaging system 10. This allows feedback to be used to maintain the electron beam intensity, size and/or shape to a given specification. The feedback information is acquired during a calibration phase during an initialization procedure for the imaging system 10. Alternatively, it is also possible to collect such feedback information during normal operation of the system 10. Such feedback is usable to correct for short and long-term changes in the X-ray source 14. The ability to control the emitters 84 in this manner allows a smaller, well-defined focal spot to be achieved, thereby improving image quality.

Additionally, the X-ray controller 28 is operative to adjust the control signals to the cathode 79 to separately energize multiple groups of the emitters 84 (which may be overlapping). For example, a first set of emitters 84 may be operative to emit a first electron beam having a first focal spot with a first shape, and a second set of emitters may be operative to emit a second electron beam having a second focal spot with a second shape. This allows two different focal spots with different shapes to be produced. This is useful where it is desirable to use the same imaging system 10 for different types of scanning procedures requiring different beam characteristics.

Additionally, the X-ray controller 28 is operative to pulse the control signals to the cathode 79 so as to cause the X-rays emitted from the anode to form an X-ray beam that pulsates. The beam current can be switched on and off quickly due to the low (e.g., 50 V or less) bias voltage and low capacitance of the device. Thus, it can be used in applications that require the X-ray beam to have a time structure. For example, in medical applications, when the portion of the patient 22 to be imaged includes a heart, it may be desirable to synchronize activation and deactivation of the cathode 79 to beating of the heart. This may be done, for example, by monitoring an electrocardiograph signal produced in response to beating of the heart. Generally, the electrocardiograph signal is periodic with each cycle corresponding to cycles of the heart. The cathode 79 may then be activated during the same portion of each of the cycles of the heart. Thus, by gating the scan using the ECG signal, the X-ray beam can be turned off except when the patient's heart is at a predetermined phase of its cycle, thereby reducing the patient's exposure to X-rays.

Additionally, the X-ray controller 28 is operative to control the control signals to the cathode 79 so as to cause the focal spot to wobble back and forth between multiple positions. This is sometimes useful in connection with techniques that use focal spot wobble to eliminate artifacts in the acquired image, currently implemented using multi-filament X-ray sources, magnetic deflection coils or electrostatic deflection plates.

In addition to the above-mentioned features, the preferred embodiment of the X-ray source 14 is also relatively simple in construction. The curved geometry eliminates the need for a complicated focusing cup and eliminates strong sensitivity to positional errors and mechanical tolerances. There is also less structure due to reduced need for a heat sink. The curved surface of the cathode 79 combines the focusing and electron emission structures into the same structure. By the use of solid state components, a large vacuum system and complicated beam deflection system is not required.

Figure 10:
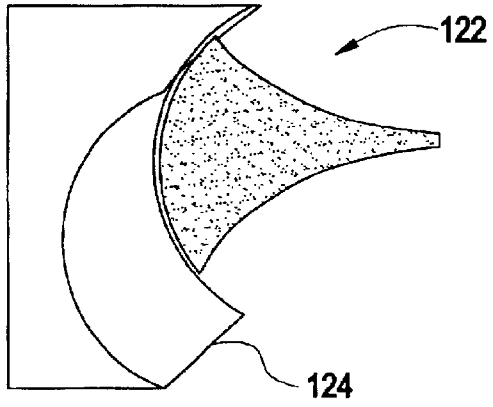
FIG. 10 is a schematic view of another solid state cathode.

Referring now to FIG 10, another embodiment of a preferred X-ray source 122 that has a curved emission surface 124 is illustrated. In FIG. 10, the emission surface 124 has the shape of a portion of a cylinder. This results in a line-focus beam that is focused to a well-defined shape and has a smooth, uniform distribution shape. Again, this geometry eliminates the complicated focusing cup and has the other benefits previously mentioned.

Figure 11:
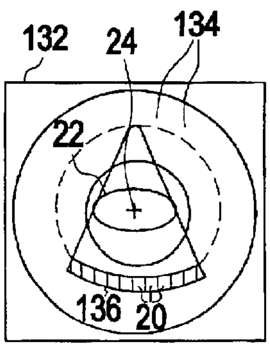
FIG. 11 is a schematic view of an alternative CT gantry using multiple solid state cathodes.

Referring now to FIG. 11, an interior view of an alternative gantry 132 for the system 10 is illustrated. A series of cold cathode X-ray sources 134 disposed in a ring about the gantry 132 is used to generate respective X-rays, each of which impinges on a corresponding detector array 136. In FIG. 11, for simplicity, only a partial ring of X-ray sources 134 is shown, however, the series of X-ray sources 134 preferably extends around the entire circumference of the gantry 132. Likewise, for simplicity, only a single detector array 136 is shown. Preferably, however, a series of detector arrays 136 extends around the circumference of the gantry 132. The detector arrays 136 may be displaced from the X-ray sources 134 along the Z-axis. With this arrangement, rather than have the gantry rotate, each of the X-ray sources is activated sequentially. Thus, the X-ray controller 28 sequentially activates the X-ray sources 134 in a manner that simulates rotation of a single X-ray source about the object of interest. Thus, by avoiding the need for a rotating gantry, the complexity of the computed tomography system is substantially reduced. A rotating anode target, filament heaters, motors and large complex support frames are eliminated. Such a system is also easier to service and, due to its reduced complexity, suffers less downtime in the field. The gantry (along with the X-ray sources and detectors) remains stationary and the patient 22 is imaged without gantry rotation.

The X-ray system 10 is particularly suited for medical imaging applications. Medical applications typically accelerate electrons toward the anode assembly 72 by applying an electric field produced with a voltage potential between about 1 kilovolt and 1000 kilovolts and more specifically between about 30 kilovolts and about 160 kilovolts. For example, in mammography and dental applications, a voltage potential of between about 20 kilovolts to 60 kilovolts is used. Cardiography and angiography systems typically use between about 80 to 120 kilovolts. Computed tomography systems typically use between about 80to 140 kilovolts.

Other applications exist for curved surface cathodes. For example, another application is an electron gun that produces hollow beams. Hollow beams are used in gyroklystron microwave tubes and in wake-field accelerator electron injectors. In each case, a thin shell cylindrical beam is used. A curved surface field emission array with a donut-shaped active area may be used to produce such a beam. Preferably, the curvature is set to produce the correct beam shape in conjunction with the focusing properties of the entire electron gun. Again, the beam area can be moved, changed, or wobbled to meet the needs of the application. Yet another application is electron beam lithography. Electron beam lithography has been proposed as a possible method for fabricating next generation semiconductor chips with features smaller than 0.13 micrometers. Using a field emitter array, the pattern to be projected onto the silicon wafer can be made at the FEA surface by allowing only certain areas to be active. The individual beamlets are transported to the substrate through a focusing structure. Other applications microwave and RF tubes (klystron, gyrotron, and so on), RF electron guns and other electron guns, scanning electron microscopes and other scanning microprobe applications.

While the embodiments illustrated in the Figures and described above are presently preferred, it should be understood that these embodiments are offered by way of example only. The invention is not limited to a particular embodiment, but extends to various modifications, combinations, and permutations that nevertheless fall within the scope and spirit of the appended claims.

What is claimed is:

1. An X-ray source comprising:

a cold cathode, the cold cathode having a curved emission surface capable of emitting electrons; and an anode, the anode being spaced apart from the cathode, the anode being capable of emitting X-rays in response to being bombarded with electrons emitted from the curved emission surface;

wherein the cold cathode comprises a plurality of emitters disposed on a substrate and a gate conductor disposed adjacent the plurality of emitters, and wherein the plurality of emitters are operative to emit electrons when a bias voltage is applied to the gate conductor;

wherein the electrons bombard the anode at a focal spot of the anode, wherein the plurality of emitters comprises a first set of emitters, the first set of emitters being operative to emit a first electron beam having a first focal spot with a first shape, and a second set of emitters, the second set of emitters being operative to emit a second electron beam having a second focal spot with a second shape, the second shape being different than the first shape, and wherein the first set of emitters and the second set of emitters are located on the same curved emission surface and are separately energizable.

2. An X-ray source according to claim 1, wherein the electrons bombard the anode at a focal spot of the anode, and wherein a size and shape of the focal spot is determined at least in part by a curvature of the curved emission surface.

3. An X-ray source according to claim 1, wherein the electrons bombard the anode at a focal spot of the anode, and wherein the plurality of emitters are addressable thereby permitting the size and shape of the focal spot to be controlled.

4. An X-ray source according to claim 1, wherein the electrons bombard the anode at a focal spot of the anode, the focal spot being characterized by an intensity distribution which describes intensity of electron bombardment as a function of position, and wherein the plurality of emitters are addressable thereby permitting the intensity distribution of the focal spot to be controlled.

5. An X-ray source according to claim 1, wherein the plurality of emitters have a density in excess of about $1\times10^{9}$ emitters/$cm^2$.

6. An X-ray source according to claim 1, wherein the plurality of emitters each have an effective emitting area on the order of about $1\times10^{-15}$ $cm^2$.

7. An X-ray source according to claim 1, wherein the bias voltage applied to the gate conductor is less than 120 V.

8. An X-ray source according to claim 1, wherein the cathode is capable of producing current densities in excess of 2400 A/$cm^2$.

9. An X-ray source according to claim 1, further comprising a vacuum housing and an X-ray transmissive window, wherein the cathode and the anode are disposed within the housing, and wherein the X-rays exit the X-ray source by way of the transmissive window.

10. An X-ray source according to claim 1, wherein the curved emission surface is fabricated so as to be curved along a first axis and straight along a second axis which is orthogonal to the first axis.

11. An X-ray source according to claim 1, wherein the cold cathode is fabricated of a monolithic semiconductor.

12. An imaging system for imaging an object of interest, the imaging system comprising:

(A) an X-ray source, the X-ray source including (1) a cold cathode disposed within a housing, the cold cathode having a curved emission surface, the cold cathode comprising a plurality of emitters disposed on a substrate, and (2) an anode, the anode being disposed within the housing and spaced apart from the cathode, the anode emitting X-rays in response to being bombarded with electrons emitted from the curved emission surface wherein the electrons bombard the anode at a focal spot of the anode;

(B) a detector array, the detector array comprising a plurality of detector elements, the plurality of detector elements receiving the X-rays after the X-rays pass through the object of interest and generating signals in response thereto;

(C) an image reconstructor, the image reconstructor being coupled to receive the signals from the detector elements, and the image reconstructor constructing an image of the object of interest based on the signals from the detector elements;

(D) a display, the display being coupled to the image reconstructor, and the display displaying the image of the object of interest; and (E) an X-ray controller, the X-ray controller being coupled to the cold cathode to provide control signals to control the emission of electrons from the plurality of emitters, the X-ray controller being coupled to receive feedback information pertaining to the operation of the imaging system, and wherein the X-ray controller adjusts the control signals for the plurality of emitters as a function of the feedback information.

13. An imaging system according to claim 12, wherein the plurality of emitters are addressable, such that the X-ray controller provides different control signals that control different ones of the plurality of emitters.

14. An imaging system according to claim 13, wherein the X-ray controller adjusts the control signals to control a size and shape of the focal spot.

15. An imaging system according to claim 13, wherein the electrons bombard the anode at a focal spot of the anode, wherein the X-ray controller adjusts the control signals to control a current density distribution of an electron beam formed by the electrons bombarding the focal spot.

16. An imaging system according to claim 12, wherein the cold cathode further comprises an insulative layer, the insulative layer being disposed on the substrate and being located between the plurality of emitters;

a gate conductor, the gate conductor being disposed on the insulative layer; and wherein the plurality of emitters are operative to emit electrons when a bias voltage is applied to the gate conductor.

17. An imaging system according to claim 12, wherein the imaging system is a computed tomography imaging system, wherein the system further comprises a plurality of additional X-ray sources, the plurality of additional X-ray sources each comprising a respective additional cold cathode and a respective additional anode, wherein the X-ray source and the plurality of additional X-ray sources are disposed in a ring so as to permit the object of interest to be imaged without gantry rotation.

18. An imaging system according to claim 17, wherein the system further comprises an X-ray controller, and wherein the X-ray controller sequentially activates the X-ray source and the plurality of additional X-ray sources in a manner that simulates rotation of a single X-ray source about the object of interest.

19. An imaging system according to claim 12, wherein the imaging system is a medical imaging system.

20. An imaging system according to claim 12, wherein the imaging system is a security checkpoint imaging system.

21. A imaging system according to claim 12, further comprising a communication interface, the communication interface being coupled to the image reconstructor, and wherein the communication interface transmits the image of the object of interest over a communication network.

22. A imaging system according to claim 12, further comprising a communication interface, the communication interface being coupled to the X-ray controller constructor, the communication interface transmitting data pertaining to the health and operation of the imaging system on a communication network.

23. An imaging system for imaging an object of interest, the imaging system comprising:

(A) an X-ray source, the X-ray source including (1) a cold cathode disposed within a housing, the cold cathode having a curved emission surface, the cold cathode comprising a plurality of emitters disposed on a substrate, and (2) an anode, the anode being disposed within the housing and spaced apart from the cathode, the anode emitting X-rays in response to being bombarded with electrons emitted from the curved emission surface;

(B) a detector array, the detector array comprising a plurality of detector elements, the plurality of detector elements receiving the X-rays after the X-rays pass through the object of interest and generating signals in response thereto;

(C) an image reconstructor, the image reconstructor being coupled to receive the signals from the detector elements and the image reconstructor constructing an image of the object of interest based on the signals from the detector elements; and (D) a display, the display being coupled to the image reconstructor, and the display displaying the image of the object of interest (E) an X-ray controller, the X-ray controller being coupled to the cold cathode to provide control signals to control the emission of electrons from the plurality of emitters, wherein the electrons bombard the anode at a focal spot of the anode and wherein the X-ray controller adjusts the control signals for the plurality of emitters to control a size and shape of the focal spot.

24. An imaging system according to claim 23, wherein the X-ray controller pulses the control signals for the plurality of emitters so as to cause the X-rays emitter from the anode to form an X-ray beam that pulsates.

25. An imaging system according to claim 23, wherein the cold cathode further comprises an insulative layer, the insulative layer being disposed on the substrate and being located between the plurality of emitters;

a gate conductor, the gate conductor being disposed on the insulative layer; and wherein the plurality of emitters are operative to emit electrons when a bias voltage is applied to the gate conductor.

26. An imaging system according to claim 23, wherein the imaging system is a computed tomography imaging system, wherein the system further comprises a plurality of additional X-ray sources, the plurality of additional X-ray sources each comprising a respective additional cold cathode and a respective additional anode, wherein the X-ray source and the plurality of additional X-ray sources are disposed in a ring so as to permit the object of interest to be imaged without gantry rotation.

27. An imaging system according to claim 23, wherein the imaging system is a medical imaging system.

28. A imaging system according to claim 23, further comprising a communication interface, the communication interface being coupled to the image reconstructor, and wherein the communication interface transmits the image of the object of interest over a communication network.

29. An imaging system for imaging an object of interest, the imaging system comprising:

(A) an X-ray source, the X-ray source including (1) a cold cathode disposed within a housing, the cold cathode having a curved emission surface, the cold cathode comprising a plurality of emitters disposed on a substrate, and (2) an anode, the anode being disposed within the housing and spaced apart from the cathode, the anode emitting X-rays in response to being bombarded with electrons emitted from the curved emission surface;

(B) a detector array, the detect array comprising a plurality of detector elements, the plurality of detector elements receiving the X-rays after the X-rays pass through the object of interest and generating signals in response thereto;

(C) an image reconstructor, the image reconstructor being coupled to receive the signals from the detector elements, and the image reconstructor constructing an image of the object of interest based on the signals from the detector elements; and (D) a display, the display being coupled to the image reconstructor, and the display displaying the image of the object of interest (E) an X-ray controller, the X-ray controller being coupled to the cold cathode to provide control signals to control the emission of electrons from the plurality of emitters, wherein the electrons bombard the anode at a focal spot of the anode; and wherein the X-ray controller adjusts the control signals for the plurality of emitters so as to cause the focal spot to wobble.

30. A medical imaging method comprising:

generating an X-ray beam at an X-ray source comprising a cathode having a curved emission surface, the cathode comprising a plurality of emitter cones and a thin film gate, the electron beam being emitted towards an anode so as to cause the anode to be bombarded with electrons, wherein the X-ray beam is produced in response to being bombarded by the electrons, wherein the electrons bombard the anode at a focal spot of the anode, wherein a size and shape of the focal spot is defined at least in part by a curvature of the curved emission surface, the generating step including emitting an electron beam from the cathode, wherein the X-ray source directs the X-ray beam through a patient, and wherein the emitting step further includes applying a first electric field between the thin film gate and the plurality of emitter cones, the first electric field causing the electrons to be emitted from the plurality of emitter cones, and applying a second electric field between the anode and the cathode, the second electric field causing the electrons to accelerate towards the anode;

detecting the X-ray beam after the X-ray beam passes through at least a portion of the patient;

constructing an image of a portion of the patient based on data collected during the detecting step; and displaying the image of the portion of the patient.

31. A method according to claim 30, wherein the portion of the patient includes a heart, and wherein the method further comprises monitoring an electrocardiograph signal produced in response to beating of the heart, the electrocardiograph signal being periodic with each cycle corresponding to cycles of the heart, and synchronizing activation and deactivation of the emitters to the electrocardiograph signal, such that the X-ray source is activated during the same portion of each of the cycles of the heart.

* * * * *